United States Patent
Gaggl

(10) Patent No.: US 7,295,021 B2
(45) Date of Patent: Nov. 13, 2007

(54) PROCESS AND CIRCUIT FOR PROTECTION OF TEST CONTACTS IN HIGH CURRENT MEASUREMENT OF SEMICONDUCTOR COMPONENTS

(75) Inventor: Rainer Gaggl, Villach (AT)

(73) Assignee: T.I.P.S. Messtechnik GmbH, Villach (AT)

( * ) Notice: Subject to any disclaimer, the term of this patent is extended or adjusted under 35 U.S.C. 154(b) by 0 days.

(21) Appl. No.: 11/079,303

(22) Filed: Mar. 15, 2005

(65) Prior Publication Data

US 2006/0091898 A1    May 4, 2006

(30) Foreign Application Priority Data

Mar. 15, 2004   (AT) ................ A 453/2004

(51) Int. Cl.
*G01R 31/073* (2006.01)
*G01R 31/28* (2006.01)

(52) U.S. Cl. ................. 324/754; 324/765
(58) Field of Classification Search ........... None
See application file for complete search history.

(56) References Cited

U.S. PATENT DOCUMENTS

| | | | | |
|---|---|---|---|---|
| 4,894,605 A | * | 1/1990 | Ringleb et al. | 324/537 |
| 5,070,297 A | * | 12/1991 | Kwon et al. | 324/754 |
| 5,497,079 A | * | 3/1996 | Yamada et al. | 324/158.1 |
| 5,600,257 A | * | 2/1997 | Leas et al. | 324/754 |
| 5,701,666 A | * | 12/1997 | DeHaven et al. | 29/831 |
| 5,781,021 A | * | 7/1998 | Ilani | 324/754 |
| 5,838,163 A | * | 11/1998 | Rostoker et al. | 324/763 |
| 5,898,633 A | * | 4/1999 | Caravella et al. | 365/226 |
| 6,005,303 A | * | 12/1999 | Hawkes et al. | 307/44 |
| 6,064,219 A | * | 5/2000 | Aigner | 324/763 |
| 6,066,979 A | * | 5/2000 | Adams et al. | 327/540 |
| 6,133,744 A | * | 10/2000 | Yojima et al. | 324/754 |
| 6,518,779 B1 | * | 2/2003 | Nakata et al. | 324/754 |
| 6,788,090 B2 | * | 9/2004 | Aihara | 324/765 |
| 6,897,670 B2 | * | 5/2005 | Burns | 324/758 |
| 2003/0234659 A1 | | 12/2003 | Zieleman | 324/765 |

FOREIGN PATENT DOCUMENTS

| | | |
|---|---|---|
| DE | 1 125 002 | 3/1962 |
| DE | 101 31 386 A1 | 2/2003 |
| EP | 0 838 688 A2 | 4/1998 |
| GB | 2 336 046 | 10/1999 |

\* cited by examiner

*Primary Examiner*—Ernest Karlsen
(74) *Attorney, Agent, or Firm*—Young & Thompson

(57) ABSTRACT

To limit the current in heavy current testing of semiconductor components with test needles, upstream of each needle a circuit is connected which has low resistance in the range of allowable currents and has high resistance above a given limit current in order to limit the current. The current source which undertakes limitation in the electrical supply lead to the probes is galvanically separated from the voltage supply of the current source itself.

5 Claims, 4 Drawing Sheets

$I_{lim}$...limiting current, $I_{nom}$...nominal current through probe, $U$....voltage drop across set up for a bi-directional current limiting through a probe setup for uni-directional current limiting in parallel probes

PROCESS AND CIRCUIT FOR PROTECTION OF TEST CONTACTS IN HIGH CURRENT MEASUREMENT OF SEMICONDUCTOR COMPONENTS

BACKGROUND OF THE INVENTION

The invention relates to a process and a measurement device for heavy current testing of semiconductor components (hereinafter called chips). The chips to be tested can be present on wafers of semiconductor material (hereinafter called semiconductor wafers). The chips to be tested can also be individual chips cut from the semiconductor wafers.

For electrical testing of semiconductor components, especially power semiconductors, such as bipolar power transistors, MOS-FETS, power diodes and IGBTs, they are tested for heavy current suitability by applying a high measurement current (typically in the range from roughly 2 A to 200 A).

In doing so the chips which have not yet been installed in their housings and which are located next to one another (not yet separated) on the semiconductor wafer make electrical contact with the contact surfaces of the front of the chip via test contacts.

Contact-making takes place typically via a so-called needle card or probe card which consists of an arrangement of extremely fine probes which is geometrically matched to the chip which is to be tested. The needle card is connected to the test system which has current and voltage sources and different electrical measurement instruments for electrical testing of the chip.

Especially when testing heavy current components, but also for other semiconductor components, such as microprocessors, overloading of the individual probes and/or contact points between the probe and tested chip can occur due to overly high test currents. These current peaks subsequently lead to damage to the probes and/or the chip which is to be tested due to the high temperatures which occur in the process.

These overcurrents (current spikes) can have various causes; examples include the following:

1. Asymmetrical current distribution for probes connected in parallel: When currents are being measured which are higher than the current carrying capacity of individual probes, the test current is routed over two or more probes which are connected in parallel. In the ideal case the test current is divided uniformly among the probes. But in practice, for example due to the poorly conducting dirt (oxidation) on the contact points, differences occur in the contact resistances of the individual probes connected in parallel, which then leads to unequal current distribution between the probes and to overloading of individual probes.
2. If a chip is tested which for example has a defect which leads to a short circuit of the current source, the maximally flowing test current is determined by the current limitation of the source. Current limitations of the sources which are set too high or which react too slowly can lead to overloading of the probes.

For a long time the problem was solved by defective probes or even complete probe cards being replaced.

Another approach to prevention of overcurrents with probes connected in parallel is the use of resistors connected in series to the individual probes for current balancing. But to be effective they should be much larger than the variation of the contact resistances of the individual probes. But this increases the total resistance of the measurement path. This is especially undesirable in heavy current measurements.

SUMMARY OF THE INVENTION

The object of the invention is to devise a process and a device in which overly high currents through individual probes are avoided, the electrical properties of the test arrangement—especially the total resistance and electrical insulation of the measurement path—not changing significantly in the range of allowable currents.

In one preferred embodiment the invention uses the property of MOS-FET transistors that depending on the control voltage between the gate and source, saturation of the source-drain current occurs almost independently of the voltage on the source-drain path.

Analogously, the bipolar transistors which are used alternatively in one embodiment within the framework of the invention have the properties of saturation of the emitter-collector current depending on the base current.

In the so-called on-state region, accordingly currents under the saturation current, an only small voltage drop occurs on the source-drain path or emitter-collector path.

To achieve the object as claimed in the invention, in one preferred embodiment at this point at least one MOS-FET transistor (or a bipolar transistor) is connected to the supply lead to the probe and is exposed to a corresponding control voltage (or a corresponding control current for the bipolar transistor) so that its characteristic is fixed such that the transistor in the range of allowable measurement currents is in the on-state region and the test arrangement is not significantly influenced by the then only small voltage drop.

If the current in the supply lead to the probe exceeds the allowable value, it is limited by the transistor which is now in the saturation current range. In the literature such a circuit is called a current source. In order to avoid electrically influencing the test arrangement by the control voltage, the control voltage is executed as voltage supply which is galvanically separated from the remainder of the test circuit. This can occur for example by the use of a DC-DC converter or a battery.

The invention uses a protective electronic circuit for current limitation of individual needles which in the area of allowable current yields a negligible change of the electrical properties of the measurement set-up compared to a probe card without this protective circuit.

This protective circuit of the invention for example has the following properties.

1. Use of a current source as described above in the electrical supply lead to the needle which however has low resistance in the range of allowable currents, but limits it at overload currents.
2. Galvanic separation of the current source which undertakes limitation in the electrical supply lead to the probe, and of the voltage supply of the current source itself. Thus the actual microchip test circuit is not influenced.

BRIEF DESCRIPTION OF THE DRAWINGS

Other details and features of the invention arise from the following description in which reference is made to the attached drawings.

DESCRIPTION OF THE PREFERRED EMBODIMENTS

Figure 1:
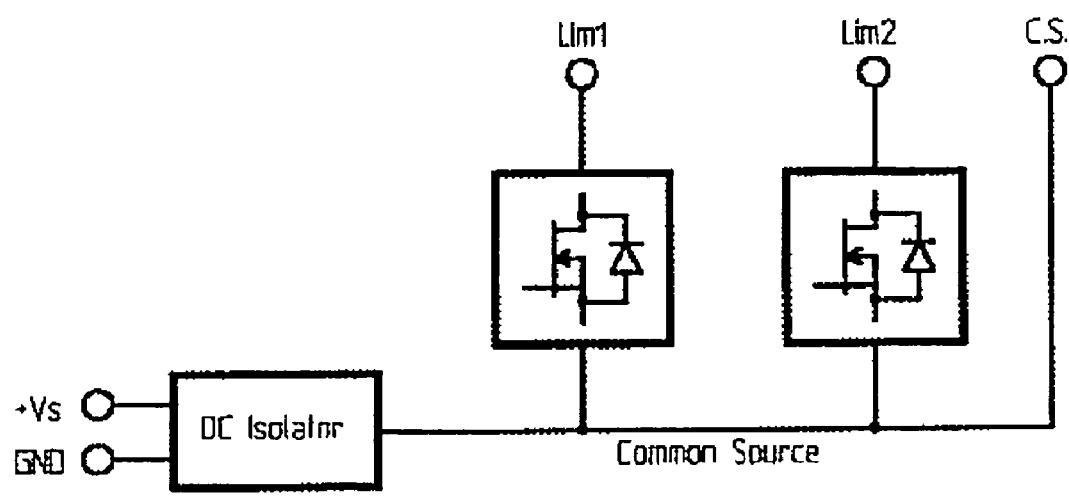
FIG. 1 shows one embodiment of a device as claimed in the invention.

In one preferred embodiment the device which is used for example for executing the process as claimed in the invention can be made for active current limitation, as shown in FIG. 1. In FIG. 1 the following symbols are used:

V+: positive voltage
Gnd: GND voltage feed
Lim1: current limiter terminal 1
Lim2: current limiter terminal 2
CS: common current source The circuit shown in FIG. 1 yields either bidirectional current limitation (positive or negative polarities) for a test needle between the Lim1 and Lim2 or a unidirectional limitation (one polarity according to the type of circuit) for two needles (Lim1, Lim2) which are connected to a voltage source (CS).

Figure 2:
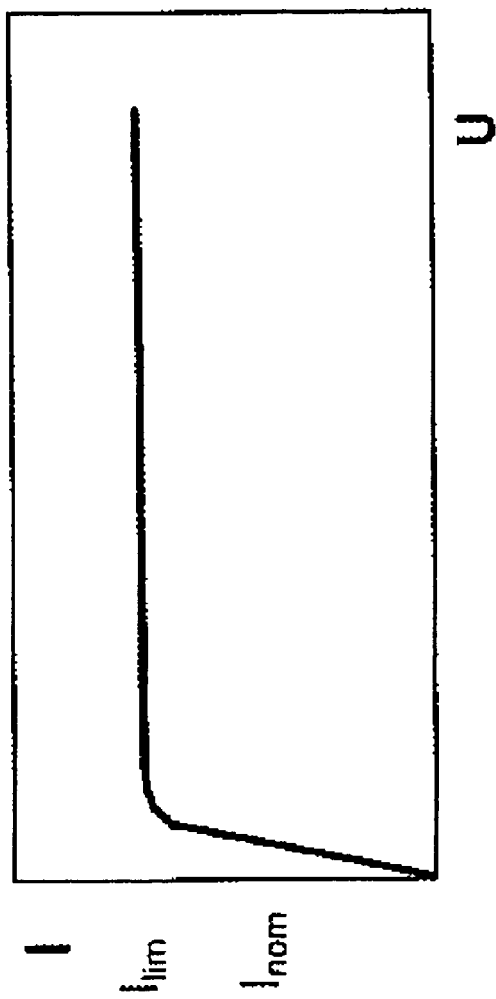
FIG. 2 shows a voltage diagram.

FIG. 2 shows in a current-voltage diagram how the electrical properties of the circuit shown in FIG. 1 are formed.

In normal operation, i.e. at current values to $I_{norm}$ the current limiter unit behaves likes a small resistor. When the limit current $I_{lim}$ is reached, the circuit limits the current to the set value. The voltage supply for the limiting unit is galvanically separated from the current limitation path.

Figure 3:
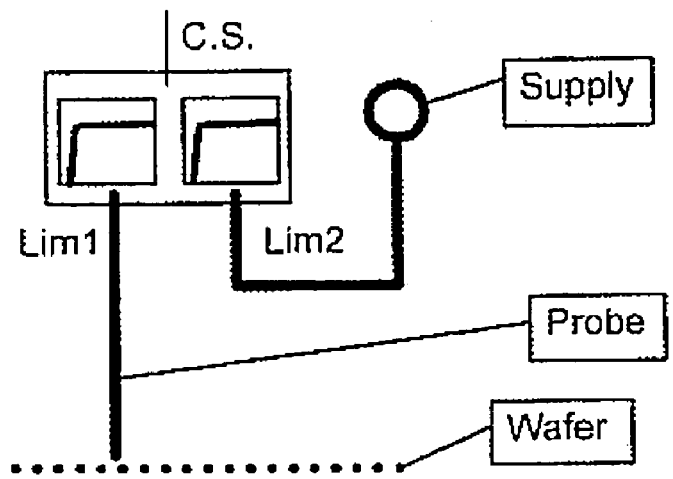
FIG. 3 shows a circuit example of a bidirectional test needle.

In the case of a bidirectional protective (for example, current supply) test needle the arrangement can be made as shown in FIG. 3. In this arrangement the current is limited both for the positive and also negative direction of the current by the needle.

Figure 4:
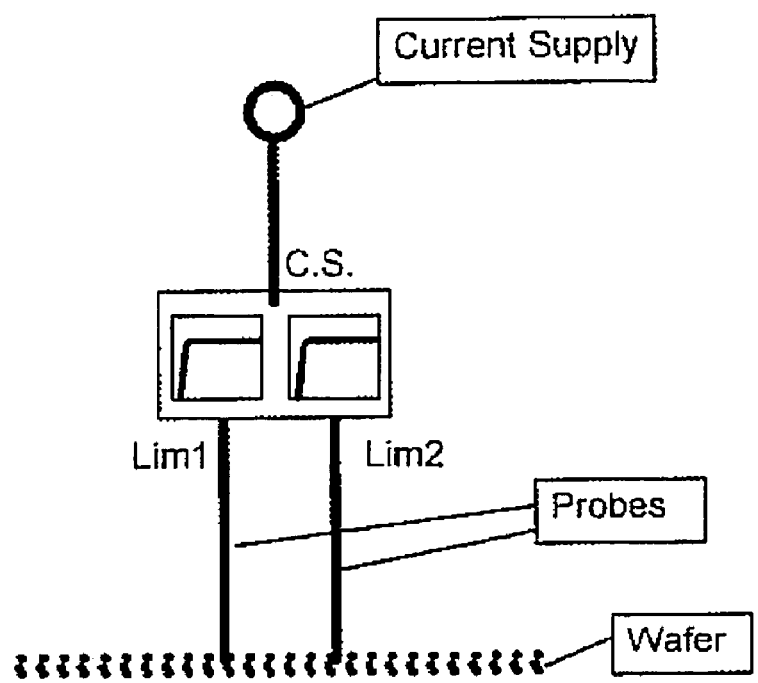
FIG. 4 shows a circuit example with two test needles.

In the version of the circuit as shown in FIG. 4, the current is divided among the test needles which are connected in parallel and limited. This circuit is used for applications in which the test current is higher than the maximum current for a test needle and thus must be divided among several test needles. The use of the circuit as claimed in the invention ensures a uniform current distribution over the needles almost independently of the changing needle contact resistances. For more than two parallel test needles additional circuits can be used. FIG. 4 shows one example of this.

The invention claimed is:

1. A process for limiting a test current in heavy current testing of semiconductor components with test needles, comprising the steps of:

connecting upstream of each needle a circuit that is connected to a voltage supply, the circuit having at least one circuit component which has low resistance in the range of allowable test currents and has high resistance above a given limit current in order to limit the test current; and supplying a control voltage or current to the at least one circuit component, wherein the supply of the control voltage or current is carried out galvanically separated from the voltage supply of the circuit.

2. The process as claimed in claim 1, wherein the at least one circuit component is a MOS-FET transistor or bipolar transistor.

3. The process as claimed in claim 1, wherein the control voltage is supplied from DC-DC converter or a battery.

4. The process as claimed in claim 2, wherein the at least one circuit component is the MOS-FET transistor and wherein the test current is limited due to saturation of a drain current of the MOS-FET transistor.

5. The process as claimed in claim 2, wherein the at least one circuit component is the bipolar transistor and wherein the test current is limited due to saturation of a collector current of the bipolar transistor.

* * * * *